(12) United States Patent
Pangella et al.

(10) Patent No.: US 8,829,842 B2
(45) Date of Patent: Sep. 9, 2014

(54) CONTROL CIRCUIT FOR AN ELECTRIC FAN FOR MOTOR VEHICLES

(71) Applicant: Johnson Electric S.A., Murten (CH)

(72) Inventors: Pierfranco Pangella, Buttigliera d'Asti (IT); Maurizio Barbero, Turin (IT)

(73) Assignee: Johnson Electric S.A., Murten (CH)

( * ) Notice: Subject to any disclaimer, the term of this patent is extended or adjusted under 35 U.S.C. 154(b) by 133 days.

(21) Appl. No.: 13/656,323

(22) Filed: Oct. 19, 2012

(65) Prior Publication Data

US 2013/0099717 A1    Apr. 25, 2013

(30) Foreign Application Priority Data

Oct. 20, 2011    (IT) .............................. TO2011A0951

(51) Int. Cl.
*H02P 7/06* (2006.01)
*H03K 17/06* (2006.01)
*H02P 7/29* (2006.01)

(52) U.S. Cl.
CPC ............. *H03K 17/063* (2013.01); *H02P 7/29* (2013.01)
USPC ......................................... 318/504; 318/494

(58) Field of Classification Search
CPC ................................. H03K 17/063; H02P 7/29
USPC ..................................... 318/504, 494
See application file for complete search history.

(56) References Cited

U.S. PATENT DOCUMENTS 4,849,651 A * 7/1989 Estes, Jr. ...................... 307/125

* cited by examiner

*Primary Examiner* — David Luo
(74) *Attorney, Agent, or Firm* — Muncy, Geissler, Olds & Lowe, P.C.

(57) ABSTRACT

A control circuit for an electric fan, has a MOSFET transistor connected essentially in series with the motor of an electric fan between the two terminals of a first D.C. voltage source and having its source terminal connected to the motor; a transistor driving stage, having an input intended to receive a pulse-width modulation control signal and an output connected to the gate terminal of the MOSFET transistor, and a bootstrap capacitor connected between a second D.C. voltage source and the source terminal of the MOSFET transistor. A controlled electronic switch having a parallel-connected diode for conducting current from the bootstrap capacitor to the motor is arranged between the bootstrap capacitor and the source terminal of the MOSFET transistor. The electronic switch has a control input or gate connected to the output of the transistor driving stage.

14 Claims, 2 Drawing Sheets

CONTROL CIRCUIT FOR AN ELECTRIC FAN FOR MOTOR VEHICLES

CROSS REFERENCE TO RELATED APPLICATIONS

This non-provisional patent application claims priority under 35 U.S.C. §119(a) from Patent Application No. TO 2011 A 000951 filed in Italy on Oct. 20, 2011.

FIELD OF THE INVENTION

This invention relates to a control circuit for an electric fan having a brush type D.C. motor and in particular, for an electric fan for use with motor vehicles.

BACKGROUND OF THE INVENTION

More specifically, the invention relates to a control circuit of the type comprising: a MOSFET transistor connected essentially in series with the motor between two terminals of a first D.C. voltage source and having its source terminal connected to the motor; a transistor driving stage, having an input intended to receive a pulse-width modulation (PWM) control signal and an output connected to the gate terminal of the MOSFET transistor, and a bootstrap capacitor connected between a second D.C. voltage source and the source terminal of the MOSFET transistor.

In control circuits of this type where the MOSFET transistor is in a so-called "high side" arrangement, namely one where the drain terminal is connected to the positive terminal of the first D.C. voltage source and the source terminal is connected to the motor, the use of a bootstrap capacitor ensures the necessary conditions for producing, where required, conduction of the MOSFET transistor, keeping the voltage between the gate and source terminals of this transistor at a value of about 10 volts or so, even when the potential of the source terminal tends to rise.

In the case of an electric fan for motor vehicles, and in particular an electric fan for the so-called "radiator set", the problem arises that, when its impeller is rotated not by the associated electric motor, but by the action of "wind" striking it during forward movement of the motor vehicle (so-called "wind milling effect"), the electric motor operates as a generator and produces at its terminals a voltage which tends to hinder recharging of the bootstrap capacitor, therefore preventing this capacitor from performing its known function described above.

SUMMARY OF THE INVENTION

Hence there is a desire for a control circuit for an electric fan for motor vehicles which is able to overcome this drawback.

This is achieved in the present invention by using, between the bootstrap capacitor and the source terminal of the MOSFET transistor, a controlled electronic switch having a parallel-connected diode for conducting current from the bootstrap capacitor to the motor, the controlled electronic switch having a control input or gate connected to the output of the transistor driving stage.

Accordingly, in one aspect thereof, the present invention provides a control circuit for an electric fan having a D.C. motor with brushes for use in motor vehicles, comprising: a first MOSFET transistor having a gate terminal, a drain terminal and a source terminal, connected essentially in series with the motor between the two terminals of a first D.C. voltage source and having the source terminal connected to the motor; a transistor driving stage, having an input intended to receive a pulse-width modulation control signal and an output connected to the gate terminal of the first MOSFET transistor; a bootstrap capacitor connected between a second D.C. voltage source and the source terminal of the first MOSFET transistor; and a controlled electronic switch connected between the bootstrap capacitor and the source terminal of the first MOSFET transistor, the controlled electronic switch having a parallel-connected diode for conducting current from the bootstrap capacitor to the motor, and having a control input or gate connected to the output of the transistor driving stage.

Preferably, the controlled electronic switch is a second MOSFET transistor, having a drain terminal connected to the source terminal of the first MOSFET transistor and a source terminal connected to the bootstrap capacitor, and wherein said diode is an internal diode of the second MOSFET transistor.

Preferably, between the gate and source terminals of the first MOSFET transistor two Zener diodes are connected in anti-series with each other.

Preferably, a Zener protection diode has a cathode and an anode respectively connected to the gate and the source of the second MOSFET transistor.

Preferably, the arrangement is such as to define a current path for charging the bootstrap capacitor, which is uncoupled from the motor via the controlled electronic switch.

Preferably, the transistor drive circuit comprises first through fourth transistors each having a base, a collector and an emitter; the base of the first transistor is connected to the input terminal, the emitter is connected to ground, the collector is connected to the second DC power source and the base of the second transistor; the emitter of the second transistor is grounded, the collector is connected to the second DC power source and the bases of the third and fourth transistors; the type of the third and fourth transistors is opposite to each other, and their collectors are respectively connected to the ends of the bootstrap capacitor, and their emitters are connected to the output terminal; the collector of the third transistor is connected to its base via a diode; the collector of the fourth transistor is connected to the second DC power source.

Preferably, a first diode is connected between the collector of the first transistor and the second DC power source, and the anode of the first diode is connected to the second DC power source.

Preferably, a second diode is connected between the collector of the second transistor and the second DC power source, and the anode of the second diode is connected to the second DC power source.

Preferably, a plurality of third diodes are connected in parallel between both terminals of the motor, and the cathodes thereof are connected to the positive input terminal of the motor.

Preferably, the first voltage source and the second voltage source are the same voltage source.

According to a second aspect thereof, the present invention provides a control circuit for controlling a fan having a DC motor, the motor having a positive terminal and a grounded negative terminal, the control circuit comprising: a bootstrap capacitor having one terminal thereof connected to a positive terminal of a DC power supply; a IGBT/MOSFET transistor having a collector/drain thereof connected to the positive terminal of the power supply, and an emitter/source thereof connected to the positive terminal of the motor; an electronic switch having two connecting terminals and a control terminal capable of controlling the connecting terminals to turn on or off, the two connecting terminals being connected to the other terminal of the bootstrap capacitor and the positive terminal of the motor; a transistor drive circuit comprising an input terminal for receiving a control signal and an output terminal connected to a base/gate of the transistor and the control terminal of the electronic switch, the transistor and the electronic switch being turned on or off at the same time under the control of the control signal.

According to a third aspect thereof, the present invention provides a control circuit for a fan, the fan including a motor and an impeller connected to the shaft of the motor, the control circuit comprising a capacitor, a drive circuit, a first switch, and a second switch; the drive circuit being configured to alternately output turn on and turn off signals to the first switch to turned the first switch on and off; the first switch being configured to be turned on when loaded with a voltage higher than a preset value and when receiving the turn on signal; the motor being connected in series with the first switch, the motor functioning as a motor for driving the fan when the first switch is turned on, and being able to function as a generator for generating back-electromotive force when the first switch is turned off; the capacitor is configured to be charged by a power supply when the first switch is turned off, and to discharge through the first switch when the first switch is turned on; the second switch is configured to connect the capacitor to the first switch for loading a voltage higher than a preset value when the drive circuit outputs the turn on signal, and to disconnect the capacitor and the motor when the first switch is turned off to avoid the back-electromotive force reducing the voltage across the capacitor.

Preferably, the second switch is controlled by the turn on and off signals from the drive circuit.

Preferably, the first switch and the second switch are both MOSFET transistors, the drain and source of the first switch are respectively connected to a positive terminal of a DC power supply and the motor, the drains of both switches are connected to the output of the drive circuit, and the capacitor is connected to the source of the first switch via the source and drain of the second switch.

BRIEF DESCRIPTION OF THE DRAWINGS

A preferred embodiment of the invention will now be described, by way of example only, with reference to figures of the accompanying drawings. In the figures, identical structures, elements or parts that appear in more than one figure are generally labeled with a same reference numeral in all the figures in which they appear. Dimensions of components and features shown in the figures are generally chosen for convenience and clarity of presentation and are not necessarily shown to scale. The figures are listed below.

DETAILED DESCRIPTION OF THE PREFERRED EMBODIMENTS

Figure 1:
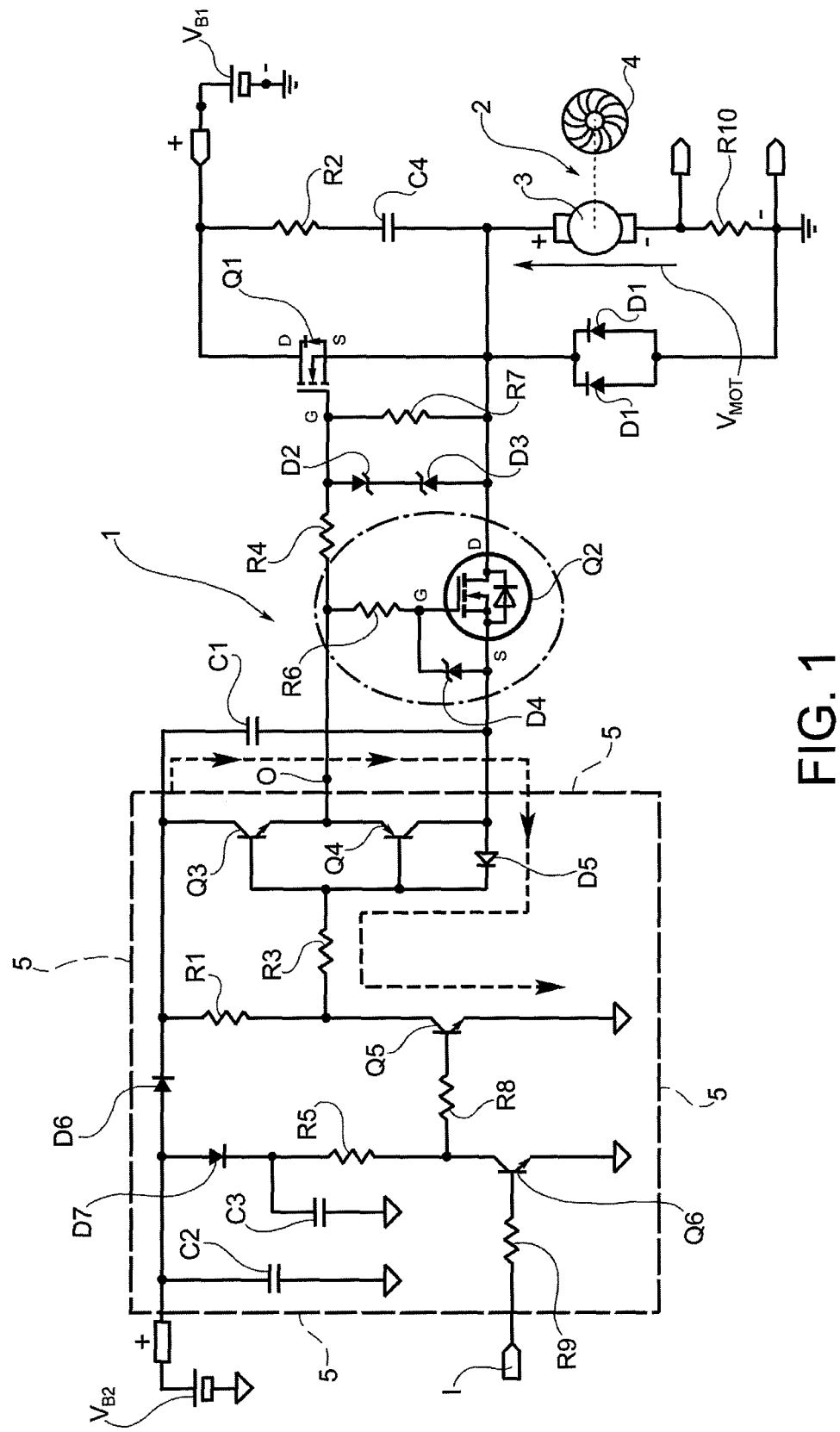
FIG. 1 is a circuit diagram of a control circuit according to the preferred embodiment of the present invention, indicating the charging path of the bootstrap capacitor.

In the figures 1 denotes overall a control circuit for an electric fan 2 which has an electric D.C. motor 3 of the type with brushes for operating an associated impeller 4.

The control circuit 1 comprises a first MOSFET transistor Q1 connected essentially in series with the motor 3 between the positive terminal and negative terminal of a D.C. voltage source $V_{B1}$.

The control circuit 1 is in particular of the so-called "high side" type and the MOSFET transistor Q1 has the drain terminal connected to the positive pole of the voltage source $V_{B1}$ and the source terminal connected to the positive brush of the motor 3.

The circuit 1 furthermore comprises a transistor driving stage which is denoted overall by 5. This driving stage has an input I intended to receive a pulse-width or pulse-duration modulation (PWM) control signal. The output O of this driving circuit 5 is connected to the gate terminal of the transistor Q1 via a resistor R4.

In the example of the embodiment shown, the driving stage 5 comprises four transistors of the bipolar type, indicated by Q3-Q6.

The transistor Q6 is of the npn type and has the base connected to the input I via a resistor R9, the emitter connected to an earth conductor and the collector connected to the cathode of a diode D7 via a resistor R5. This diode D7 has the anode connected to the positive terminal of a voltage source $V_{B2}$, such as the battery set of the motor vehicle.

Two capacitors C2 and C3 are connected between the anode and the cathode, respectively, of the diode D7 and an earth conductor.

The transistor Q5 is also of the npn type and has the base connected to the collector of Q6 via a resistor R8, the emitter connected to earth and the collector connected to the bases of the transistors Q3 and Q4 via a resistor R3. The collector of Q5 is also connected to the cathode of a diode D6 via a resistor R1. The anode of this diode D6 is connected to the anode of the diode D7.

The transistor Q3 is also of the npn type and has the collector connected to the cathode of the diode D6 and the emitter connected to that of the transistor Q4 which is instead of the pnp type. A diode D5 is connected between the base and the collector of transistor Q4.

The output O of the driving stage 5 corresponds to the emitters of the transistors Q3 and Q4.

The control circuit 1 also comprises a bootstrap capacitor which is denoted by C1. This capacitor is connected between the collectors of the transistors Q3 and Q4 and one of its terminals is therefore connected to the voltage source $V_{B2}$ via the diode D6.

The other terminal of the bootstrap capacitor C1 is connected to the source terminal of the MOSFET transistor Q1 via a second MOSFET transistor Q2.

In particular the MOSFET transistor Q2 has a source terminal connected to the bootstrap capacitor C1 and a drain terminal connected to the source terminal of the MOSFET transistor Q1 and also to the positive terminal or brush of the motor 3.

The gate terminal of Q2 is connected to the output O of the driving stage 5 via a resistor R6. A Zener protection diode D4 has an anode and a cathode connected to the source and the gate, respectively, of Q2.

Two Zener diodes D2 and D3, connected in anti-series with each other, are connected between the gate and source terminals of the MOSFET transistor Q1, and a resistor R7 is connected in parallel with the two Zener diodes D2 and D3.

A shunt resistor R10 is connected between the negative terminal or brush of the motor 3 and the associated earth conductor. A set of diodes D1 connected in parallel, is connected between this earth conductor and the positive brush of the motor 3.

A capacitor C4 and a resistor R2 are connected in series with each other, between the positive terminal or brush of the motor 3 and the positive terminal of the voltage source $V_{B1}$.

The control circuit 1 described above operates essentially in the manner described below.

When a stable signal at level "0" is present at the input I of the driving stage 5, the transistor Q6 is disabled, the transistor Q5 is conducting and the transistors Q3 and Q4 are disabled. Consequently the output O of the driving stage 5 is also at level "0" and the MOSFET transistor Q1 is disabled. The electric motor 3 of the electric fan 2 is thus deactivated.

In these conditions, if the impeller 4 of the electric fan 2 is at a standstill or substantially immobile, no voltage is produced at the terminals of the motor 3. The bootstrap capacitor C1 is charged and remains charged owing to the current flow along the path indicated in broken lines in FIG. 1, from the voltage source $V_{B2}$, via the diode D6, the capacitor C1, the diode D5, the resistor R3, the collector-emitter path of the transistor Q5 and the associated earth conductor. This path is uncoupled from the current path to the load via the device Q2. Charging of the bootstrap capacitor C1 is performed independently of the voltage at the terminals of the motor 3. The bootstrap capacitor C1 is therefore permanently ready to intervene in order to perform its function intended to ensure subsequent switching of the MOSFET transistor Q1.

If, on other hand, in the aforementioned conditions, the impeller is rotated by the "wind" produced by the forward movement of the motor vehicle, the motor 3 therefore operates as a generator, producing at its terminals a voltage indicated by $V_{MOT}$ in FIG. 1. The bootstrap capacitor C1 therefore tends to be charged, as described above, but the voltage $V_{MOT}$ produced by the motor 3 operating as a generator would tend to reduce the voltage at its terminals.

With the control circuit 1 according to the invention, in such a condition the parasite or internal diode of the MOSFET transistor Q2 intervenes and therefore uncouples the voltage $V_{MOT}$ from the bootstrap capacitor C1 which may continue to be charged as when there is no wind induced by the forward movement of the motor vehicle.

Figure 2:
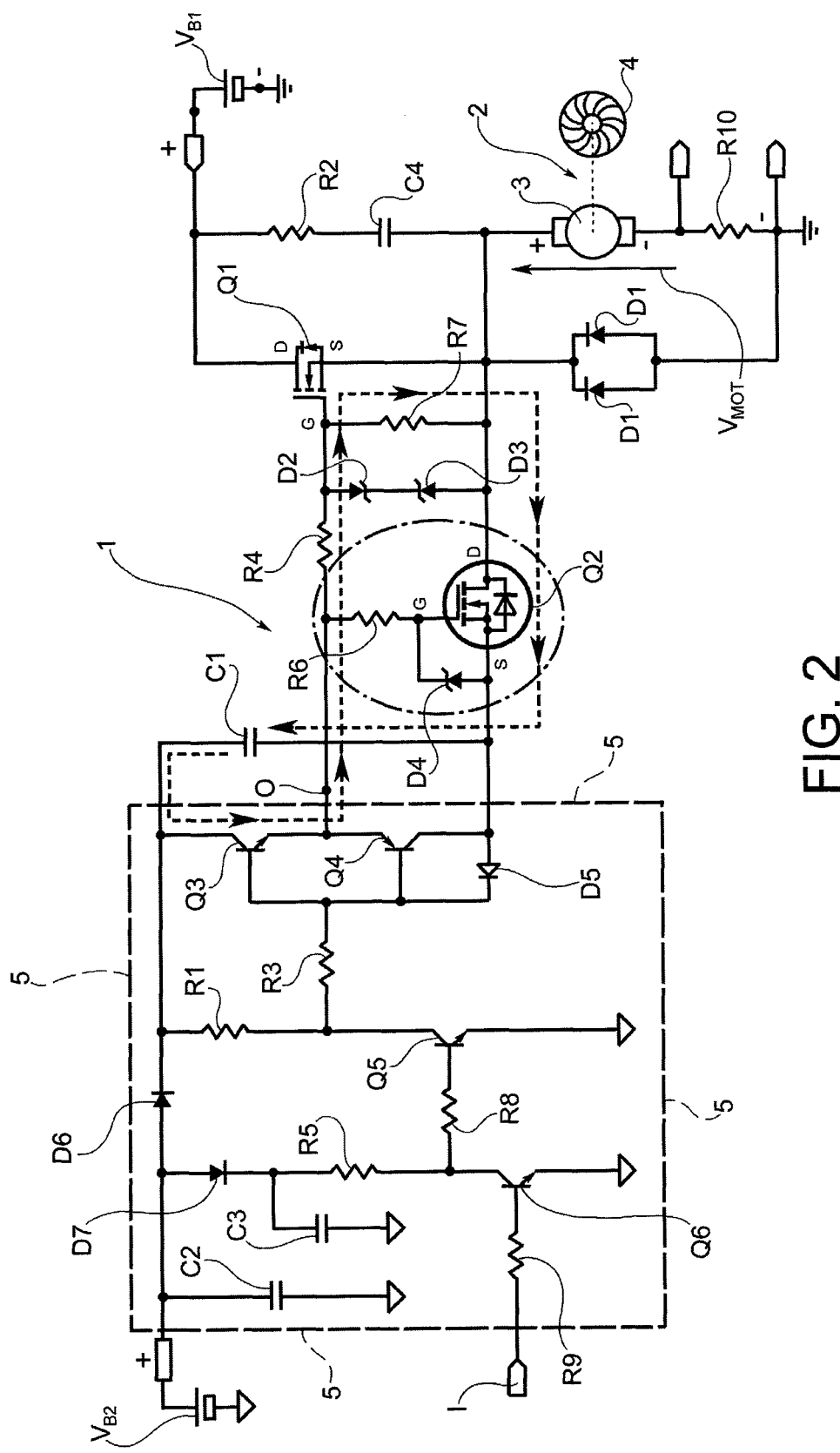
FIG. 2 is the circuit diagram of FIG. 1, indicating the discharge path of the bootstrap capacitor.

The application of a pulse-width modulation (PWM) signal to the input I of the driving stage 5 produces at the output O of this stage 5 a correspondingly modulated dual-state signal which alternatively enables conduction and disables the MOSFET transistors Q1 and Q2. In particular, when the output O of the driving stage 5 is at level "1" the transistors Q1 and Q2 are both conducting and the bootstrap capacitor C1 is discharged partially owing to the flow of a current along the path shown in broken lines in FIG. 2.

In fact, when the control signal is present at the input I of the driving stage, the bootstrap capacitor C1 is coupled to the electric motor 3 of the electric fan 2 in a typical configuration according to the prior art and performs in a regular manner the function for which it is designed.

In the description and claims of the present application, each of the verbs "comprise", "include", "contain" and "have", and variations thereof, are used in an inclusive sense, to specify the presence of the stated item but not to exclude the presence of additional items.

Although the invention is described with reference to one or more preferred embodiments, it should be appreciated by those skilled in the art that various modifications are possible. Therefore, the scope of the invention is to be determined by reference to the claims that follow.

For example, although the first and second voltages sources $V_{B1}$ and $V_{B2}$ are shown and described as being separate voltage sources, they may be one and the same. Also, the MOSFET(s) may be replaced by IGBTs.

The invention claimed is:

1. A control circuit for an electric fan having a D.C. motor with brushes for use in motor vehicles, comprising:

a first MOSFET transistor having a gate terminal, a drain terminal and a source terminal, connected essentially in series with the motor between the two terminals of a first D.C. voltage source and having the source terminal connected to the motor;

a transistor driving stage, having an input intended to receive a pulse-width modulation control signal and an output connected to the gate terminal of the first MOSFET transistor;

a bootstrap capacitor connected between a second D.C. voltage source and the source terminal of the first MOSFET transistor; and a controlled electronic switch connected between the bootstrap capacitor and the source terminal of the first MOSFET transistor, the controlled electronic switch having a parallel-connected diode for conducting current from the bootstrap capacitor to the motor, and having a control input or gate connected to the output of the transistor driving stage.

2. The control circuit of claim 1, wherein the controlled electronic switch is a second MOSFET transistor, having a drain terminal connected to the source terminal of the first MOSFET transistor and a source terminal connected to the bootstrap capacitor, and wherein said diode is an internal diode of the second MOSFET transistor.

3. The control circuit of claim 2, wherein a Zener protection diode has a cathode and an anode respectively connected to the gate and the source of the second MOSFET transistor.

4. The control circuit of claim 1, wherein between the gate and source terminals of the first MOSFET transistor two Zener diodes are connected in anti-series with each other.

5. The control circuit of claim 1, wherein the arrangement is such as to define a current path for charging the bootstrap capacitor, which is uncoupled from the motor via the controlled electronic switch.

6. The control circuit of claim 5, wherein the transistor drive circuit comprises first through fourth transistors each having a base, a collector and an emitter; the base of the first transistor is connected to the input terminal, the emitter is connected to ground, the collector is connected to the second DC power source and the base of the second transistor; the emitter of the second transistor is grounded, the collector is connected to the second DC power source and the bases of the third and fourth transistors; the type of the third and fourth transistors is opposite to each other, and their collectors are respectively connected to the ends of the bootstrap capacitor, and their emitters are connected to the output terminal; the collector of the third transistor is connected to its base via a diode; the collector of the fourth transistor is connected to the second DC power source.

7. The control circuit of claim 6, wherein a first diode is connected between the collector of the first transistor and the second DC power source, and the anode of the first diode is connected to the second DC power source.

8. The control circuit of claim 6, wherein a second diode is connected between the collector of the second transistor and the second DC power source, and the anode of the second diode is connected to the second DC power source.

9. The control circuit of claim 6 further comprising a plurality of third diodes, wherein the third diodes are connected in parallel between both terminals of the motor, and the cathodes thereof are connected to the positive input terminal of the motor.

10. The control circuit of claim 1, wherein said first voltage source and said second voltage source are the same.

11. A control circuit for controlling a fan having a DC motor, the motor having a positive terminal and a grounded negative terminal, the control circuit comprising:
- a bootstrap capacitor having one terminal thereof connected to a positive terminal of a DC power supply;
- a IGBT/MOSFET transistor having a collector/drain thereof connected to the positive terminal of the power supply, and an emitter/source thereof connected to the positive terminal of the motor;
- an electronic switch having two connecting terminals and a control terminal capable of controlling the connecting terminals to turn on or off, the two connecting terminals being connected to the other terminal of the bootstrap capacitor and the positive terminal of the motor;
- a transistor drive circuit comprising an input terminal for receiving a control signal and an output terminal connected to a base/gate of the transistor and the control terminal of the electronic switch, the transistor and the electronic switch being turned on or off at the same time under the control of the control signal.

12. A control circuit for a fan, the fan including a motor and an impeller connected to the shaft of the motor, said control circuit comprising a capacitor, a drive circuit, a first switch, and a second switch;
- said drive circuit being configured to alternately output turn on and turn off signals to the first switch to turned the first switch on and off;
- said first switch being configured to be turned on when loaded with a voltage higher than a preset value and when receiving said turn on signal;
- said motor being connected in series with said first switch, said motor functioning as a motor for driving the fan when the first switch is turned on, and being able to function as a generator for generating back-electromotive force when the first switch is turned off;
- said capacitor is configured to be charged by a power supply when the first switch is turned off, and to discharge through the first switch when the first switch is turned on;
- said second switch is configured to connect said capacitor to the first switch for loading a voltage higher than a preset value when said drive circuit outputs said turn on signal, and to disconnect the capacitor and the motor when the first switch is turned off to avoid the back-electromotive force reducing the voltage across the capacitor.

13. The control circuit of claim 12, wherein said second switch is controlled by the turn on and off signals from said drive circuit.

14. The control circuit of claim 13, wherein said first switch and said second switch are both MOSFET transistors, the drain and source of the first switch are respectively connected to a positive terminal of a DC power supply and the motor, the drains of both switches are connected to the output of the drive circuit, and the capacitor is connected to the source of the first switch via the source and drain of the second switch.

* * * * *